United States Patent
Yamashita et al.

(10) Patent No.: US 10,351,947 B2
(45) Date of Patent: Jul. 16, 2019

(54) THIN-FILM FORMING DEVICE

(71) Applicant: TORAY ENGINEERING CO., LTD., Chuo-ku, Tokyo (JP)

(72) Inventors: Masamichi Yamashita, Otsu (JP); Toshiyuki Jinda, Otsu (JP); Takayoshi Fujimoto, Otsu (JP); Katsuyoshi Miyashita, Otsu (JP)

(73) Assignee: TORAY ENGINEERING CO., LTD., Tokyo (JP)

( * ) Notice: Subject to any disclaimer, the term of this patent is extended or adjusted under 35 U.S.C. 154(b) by 103 days.

(21) Appl. No.: 15/306,416

(22) PCT Filed: Feb. 23, 2015

(86) PCT No.: PCT/JP2015/054985
§ 371 (c)(1),
(2) Date: Oct. 24, 2016

(87) PCT Pub. No.: WO2015/170499
PCT Pub. Date: Nov. 12, 2015

(65) Prior Publication Data
US 2017/0044662 A1    Feb. 16, 2017

(30) Foreign Application Priority Data
May 9, 2014    (JP) ................. 2014-097511

(51) Int. Cl.
*C23C 14/04*    (2006.01)
*C23C 14/24*    (2006.01)
(Continued)

(52) U.S. Cl.
CPC .......... *C23C 14/562* (2013.01); *C23C 14/042* (2013.01); *C23C 14/24* (2013.01);
(Continued)

(58) Field of Classification Search
CPC ..... C23C 14/56; C23C 14/562; C23C 14/564; C23C 14/0063; C23C 14/0068;
(Continued)

(56) References Cited

U.S. PATENT DOCUMENTS

| 9,777,365 | B2 * | 10/2017 | Stowell, Jr. | .......... B05D 3/0486 |
| 2006/0159844 | A1 * | 7/2006 | Moriwaki | ............. C23C 14/562 |
| | | | | 427/127 |
| 2012/0240854 | A1 * | 9/2012 | Hayakawa | ............... B05D 1/60 |
| | | | | 118/719 |

FOREIGN PATENT DOCUMENTS

| JP | 2001-023907 A | 1/2001 |
| JP | 2001-303249 A | 10/2001 |

(Continued)

OTHER PUBLICATIONS

International Search Report of the corresponding International Application No. PCT/JP2015/054985, dated May 26, 2015.

*Primary Examiner* — Michael A Band
(74) *Attorney, Agent, or Firm* — Global IP Counselors, LLP

(57) ABSTRACT

A thin-film forming device forms a thin film on a strip-shaped substrate by subjecting the strip-shaped substrate to a surface treatment while conveying the strip-shaped substrate in a state of being laid along an outer peripheral face of a main roll. The thin-film forming device comprises: a main roll chamber accommodating the main roll; a plurality of film formation chambers arranged in a peripheral direction of the main roll, the film formation chambers having partitions disposed radially outward of the main roll; and a main roll cover covering the outer peripheral face of the main roll over which the strip-shaped substrate travels, the main roll cover being provided to the partitions, the main roll cover having a film formation chamber communication component that communicates with the film formation
(Continued)

chambers. A pressure in an interior of the main roll cover defined between the main roll cover and the outer peripheral face of the main roll is set to be higher than a pressure in the film formation chambers.

6 Claims, 6 Drawing Sheets

(51) Int. Cl.
    *C23C 14/34*     (2006.01)
    *C23C 14/56*     (2006.01)
    *C23C 14/44*     (2006.01)
    *C23C 16/455*     (2006.01)
    *C23C 16/505*     (2006.01)
    *C23C 16/54*     (2006.01)
    *H01J 37/34*     (2006.01)
    *C23C 16/44*     (2006.01)

(52) U.S. Cl.
    CPC ............ *C23C 14/34* (2013.01); *C23C 14/564* (2013.01); *C23C 16/4409* (2013.01); *C23C 16/45519* (2013.01); *C23C 16/505* (2013.01); *C23C 16/545* (2013.01); *H01J 37/34* (2013.01)

(58) Field of Classification Search
    CPC ....... C23C 14/042; C23C 14/24; C23C 14/34; C23C 16/4409; C23C 16/45519; C23C 16/505; C23C 16/545; H01J 37/34
    USPC ...................... 427/127; 118/719; 204/298.24
    See application file for complete search history.

(56) References Cited

FOREIGN PATENT DOCUMENTS

| | | |
|---|---|---|
| JP | 2007-186775 A | 7/2007 |
| JP | 2011-042848 A | 3/2011 |
| JP | 2013-194253 A | 9/2013 |
| JP | 2014-065932 A | 4/2014 |
| WO | 2010-052846 A1 | 5/2010 |

* cited by examiner

THIN-FILM FORMING DEVICE

CROSS-REFERENCE TO RELATED APPLICATIONS

This application is a U.S. National stage of International Application No. PCT/JP2015/054985 filed on Feb. 23, 2015. This application claims priority to Japanese Patent Application No. 2014-097511 filed with Japan Patent Office on May 9, 2014. The entire disclosure of Japanese Patent Application No. 2014-097511 is hereby incorporated herein by reference.

BACKGROUND

Field of the Invention

The present invention relates to a thin-film forming device for forming a thin film on a strip-shaped substrate, and more particularly relates to a thin-film forming device for forming a plurality of types of thin film with good purity on a strip-shaped substrate by passing the strip-shaped substrate through a plurality of chambers while conveying it over a roll.

Background Information

Films equipped with a barrier film have been used in recent years, in which a barrier film is formed on the surface of a plastic film for such purposes as preventing oxidation and preventing the incursion of moisture. A barrier-film-equipped film such as this is formed by the thin-film forming device discussed in Japanese Unexamined Patent Application Publication No. 2001-303249 (Patent Literature 1).

SUMMARY

As shown in FIG. 6, for example, a thin-film forming device comprises a main roll chamber 101, a main roll 102 that accommodates this main roll chamber 101, a feeder 105 that plays out a strip-shaped substrate 103, and a winder 104 onto which the strip-shaped substrate 103 is wound. The strip-shaped substrate 103 fed out from the feeder 105 is laid onto the outer peripheral face 102a of the main roll 102 and wound by the winder 104. Partitions 106 are provided on the outside diameter side of the main roll 102 to form a plurality of film formation chambers 107 in the peripheral direction of the main roll 102. Vacuum vapor deposition and sputtering are provided as film formation sources inside these film formation chambers 107. With this thin-film forming device, the specified thin films are successively laminated over the strip-shaped substrate 103 by passing the strip-shaped substrate 103 supplied from the feeder 105 through these film formation chambers 107 in a state of being laid over the outer peripheral face 102a of the main roll 102.

With the above-mentioned thin-film forming device, however, a problem was that there was a risk of poor quality of the resulting thin film. That is, with the above thin-film forming device, the walls of the partitions 106 forming the film formation chambers 107 were formed extending as close as possible to the outer peripheral face 102a of the main roll 102, but there was a slight gap between these walls and the main roll 102. Accordingly, there is a problem in that the thin-film material gas supplied in one film formation chamber 107 may work its way through a tiny gap into an adjacent film formation chamber 107, and this could affect the quality (purity) of the thin film formed in the film formation chambers 107. Particularly when CVD is used as the film formation source, the pressure inside the film formation chambers 107 is far higher than with vacuum vapor deposition or sputtering, so there is a greater probability that the thin-film material will go through the gap and into another film formation chamber 107, and this markedly affects film quality.

Also, in Japanese Unexamined Patent Application Publication No. 2007-186775 (Patent Literature 2), an anti-gap roller is provided between the partitions and the main roll. However, when a roller is thus provided, since the roller is in contact with the surface of the strip-shaped substrates, the roller touches the thin film immediately after it has been produced, which is a problem in that the quality of the thin films thus formed will suffer.

The present invention was conceived in light of the above problem, and it is an object thereof to provide a thin-film forming device with which the thin-film material gas in one film formation chamber will be less likely to find its way into another film formation chamber, so that there is less of a decrease in the quality of the thin films that are formed.

The thin-film forming device of the present invention aimed at solving the above problem is a thin-film forming device for forming a thin film on a strip-shaped substrate by subjecting the strip-shaped substrate to a surface treatment while conveying the strip-shaped substrate in a state of being laid along the outer peripheral face of a main roll, the device comprising a main roll chamber that accommodates the main roll, and a plurality of film formation chambers arranged in the peripheral direction of the main roll by disposing partitions on the outside diameter side of the main roll, wherein a main roll cover that covers the outer peripheral face of the main roll over which the strip-shaped substrate travels is provided to the partitions, a film formation chamber communication component that communicates with the film formation chambers is formed on this main roll cover, and the pressure inside the main roll cover produced at the main roll cover and the outer peripheral face of the main roll is set to be higher than the pressure in the film formation chambers.

With the above thin-film forming device, the main roll cover provided to the partitions makes it less likely that thin-film material gas will find its way into another film formation chamber. More specifically, when thin-film material gas is supplied to one film formation chamber, the thin-film material gas spreads out to fill this film formation chamber, and comes into contact with the surface of the strip-shaped substrate traveling over the outer peripheral face of the main roll, thereby forming a thin film on the surface of the strip-shaped substrate. The thin-film material gas inside the film formation chamber then tries to go through the film formation chamber communication component of the main roll cover inside the main roll cover, but since the pressure inside this main roll cover is set higher than the pressure in the film formation chamber, the thin-film material gas that is trying to get in through the film formation chamber communication component is pushed back into the original film formation chamber. Therefore, it is less likely that the thin-film material gas supplied to one film formation chamber will find its way into an adjacent film formation chamber, so the purity of the thin-film material gas formed in one film formation chamber can be maintained, and the quality of the thin film that is formed is less likely to decrease.

Also, the main roll cover has a roll opposing face that is opposite the outer peripheral face of the main roll, and the film formation chamber communication component is formed by an opening that opens to the film formation chambers and a cover gap formed by the roll opposing face and the main roll outer peripheral face.

With this configuration, pressure loss is increased because the size of the cover gap formed by the roll opposing face and the main roll outer peripheral face is kept as small as possible. Therefore, the thin-film material gas in the film formation chamber tends not to go through the opening and into the film formation chamber communication component, so the thin-film material gas in one film formation chamber is more effectively prevented from finding its way into an adjacent film formation chamber.

Also, the configuration may be such that the main roll cover is provided continuously to the adjacent partitions, and the roll opposing face is cut out to form the opening, so that a film formation region is formed by the opening, and a mask region is formed by the roll opposing face.

With this configuration, the film formation region and the mask region with respect to the strip-shaped substrate can be adjusted by adjusting the region of the opening formed in the roll opposing face.

Also, the configuration can be such that an inert gas is supplied inside the main roll cover to set the pressure inside the main roll cover higher than the pressure in the film formation chambers.

With this configuration, since the pressure inside the main roll cover is set higher by supplying an inert gas inside the main roll cover, the inert gas will go through the film formation chamber communication component and into the film formation chamber. However, since the inert gas does not affect the formation of the thin film, there is no decrease in the film quality, and the pressure inside the main roll cover can be kept high.

With the thin-film forming device of the present invention, movement of the thin-film material gas into another film formation chamber is suppressed, so the quality of the thin film that is formed is less likely to decrease.

DETAILED DESCRIPTION OF EMBODIMENTS

Figure 1:
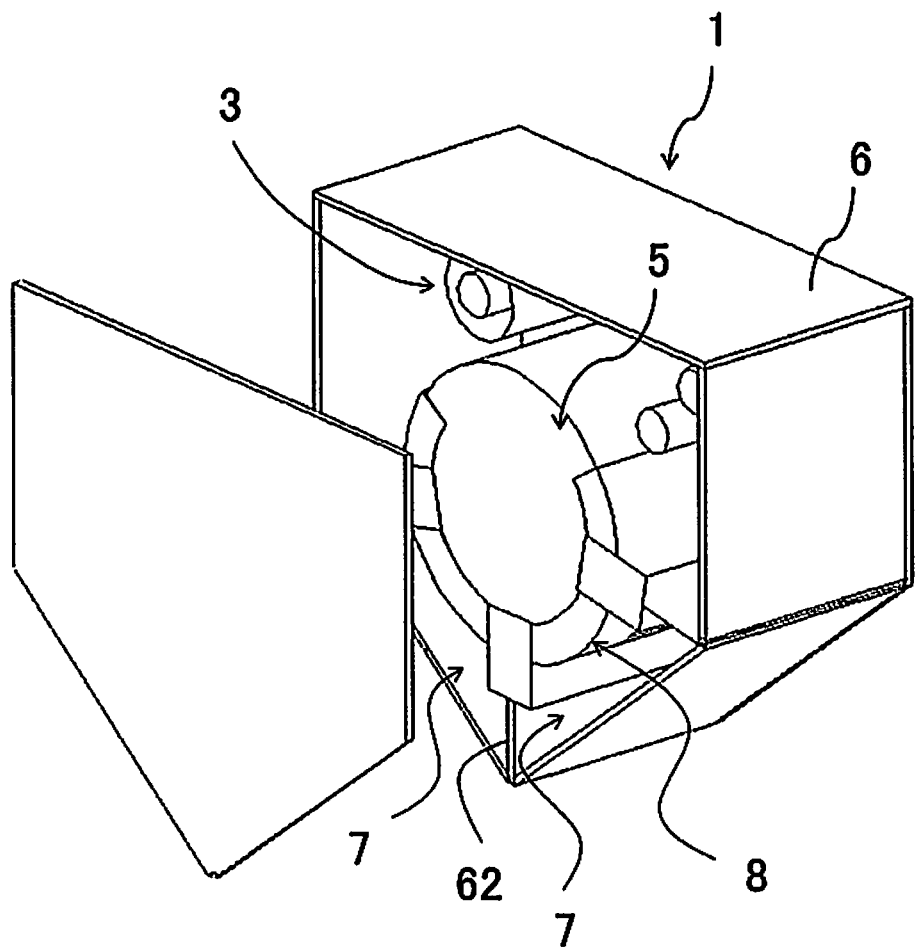
FIG. 1 is a simplified oblique view of the thin-film forming device in an embodiment.

Embodiments of the present invention will now be described through reference to the drawings. FIG. 1 is an oblique view of the thin-film forming device 1 in an embodiment, and FIG. 2 is a simplified configuration diagram showing a front view thereof.

The thin-film forming device 1 forms thin films by subjecting a substrate to surface treatment. For example, it can be used to form a barrier film, whose purpose is to prevent the infiltration of moisture or to prevent oxidation, on a plastic film, or with sealing films in flexible solar batteries. More specifically, in the case of a sealing film for a flexible solar battery, a solar battery cell is formed by laminating various electrode layers, opto-electrical conversion layers, and so forth over a plastic film or other such strip-shaped substrate, and then laminating a plurality of layers of thin film over the solar battery cell with the thin-film forming device 1 to form a barrier film. This effectively prevents the incursion of moisture into the solar battery cell, and forms a flexible solar battery with excellent oxidation characteristics.

Figure 2:
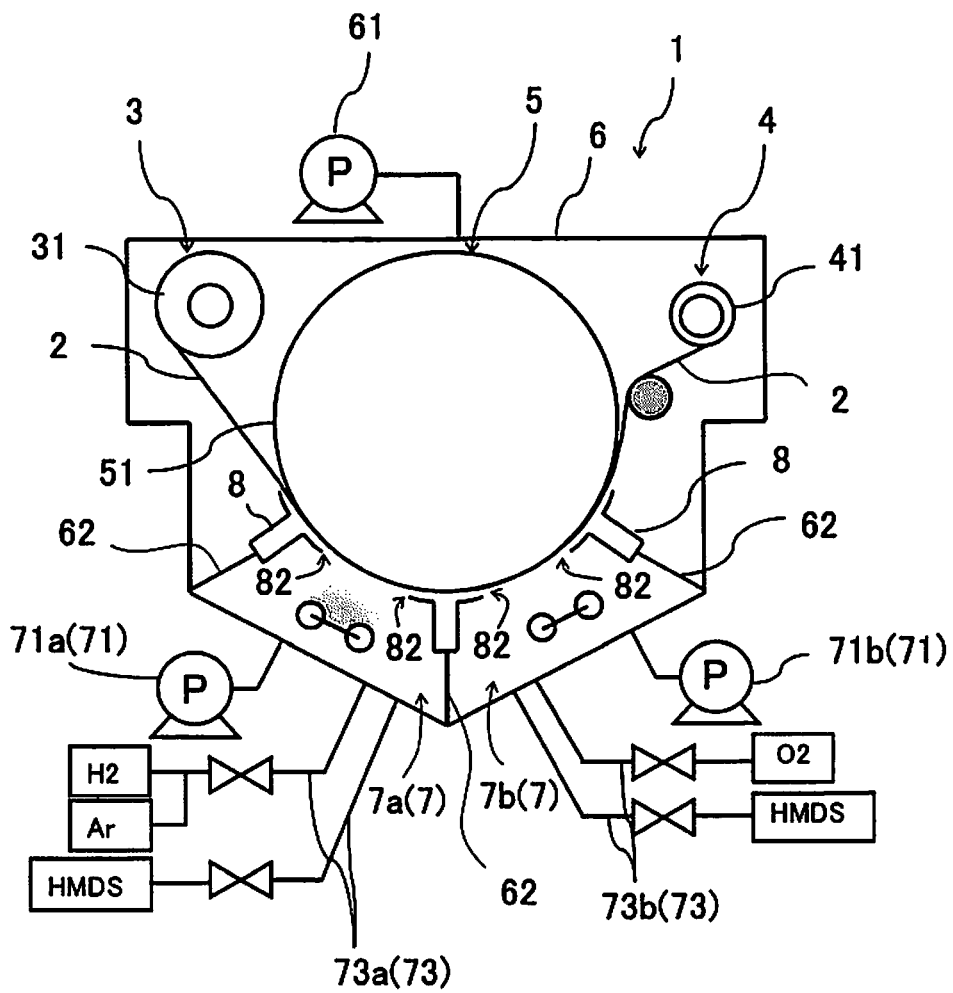
FIG. 2 is a simplified configuration diagram showing a front view of the above-mentioned thin-film forming device.

As shown in FIGS. 1 and 2, this thin-film forming device 1 has a substrate feeder 3 that supplies a strip-shaped substrate 2, a substrate winder 4 that winds up the supplied strip-shaped substrate 2, a main roll 5 disposed between the substrate feeder 3 and the substrate winder 4, a main roll chamber 6 that houses these, and film formation chambers 7 in which thin films are formed. The strip-shaped substrate 2 fed out from the substrate feeder 3 is conveyed while laid over the outer peripheral face 51 of the main roll 5, and passes through the film formation chambers 7, in which a thin film is formed over the strip-shaped substrate 2 and the product is wound onto the substrate winder 4.

The substrate feeder 3 is used to supply the strip-shaped substrate 2 downstream. The substrate feeder 3 has a feed roll 31 that winds up the strip-shaped substrate 2, and controls the drive of this feed roll 31 so that the strip-shaped substrate 2 can be played out. That is, the rotation of the feed roll 31 is controlled by a control device (not shown) so that the amount of strip-shaped substrate 2 played out can be increased or decreased. More specifically, the strip-shaped substrate 2 is played out downstream by rotating the feed roll 31 in a state in which the strip-shaped substrate 2 is under tension from the downstream side, and the feed roll 31 is braked as needed so that the strip-shaped substrate 2 will be played out at a constant speed without sagging.

The strip-shaped substrate 2 here is a slender, thin piece that extends in one direction, and a strip having a thickness of 0.01 to 0.2 mm and a width of 5 to 1000 mm is used. There are no particular restrictions on the material, but stainless steel, copper, and other such metals, as well as plastic films and the like can be used to advantage.

The substrate winder 4 is used to wind up the supplied strip-shaped substrate 2. The substrate winder 4 has a winding roll 41 similar to the feed roll 31, and can wind up the strip-shaped substrate 2 by controlling the drive of this winding roll 41. Specifically, the rotation of the winding roll 41 is controlled by a control device (not shown) so that the amount of strip-shaped substrate 2 that is wound can be increased or decreased. More specifically, the rotation of the winding roll 41 is adjusted so as to avoid sagging of the played out strip-shaped substrate 2, and conversely the strip-shaped substrate 2 can be wound such that it is subjected to no more tension than necessary.

The main roll 5 is used to maintain the orientation of the strip-shaped substrate 2 during film production, while conveying the strip-shaped substrate 2 supplied from the substrate feeder 3 on the upstream side to the substrate winder 4 on the downstream side. The main roll 5 is disposed between the substrate feeder 3 and the substrate winder 4, and is formed in a substantially cylindrical shape that is larger in diameter than the feed roll 31 and the winding roll 41. The outer peripheral face 51 of the main roll 5 is formed as a curved surface with a constant radius of curvature in the peripheral direction, and is drive is controlled by a control device (not shown) according to the rotation of the feed roll 31 and the winding roll 41. Also, compared to the feed roll 31 and the winding roll 41, the main roll 5 is provided at a position where its outer peripheral face 51 sticks out downward, and the strip-shaped substrate 2 is laid over this protruding outer peripheral face 51. That is, the strip-shaped substrate 2 played out from the substrate feeder 3 is conveyed in a state of being subjected to a certain tension as a result of coming into contact with the outer peripheral face 51 of the main roll 5. Specifically, the strip-shaped substrate 2 that is touching the outer peripheral face 51 of the main roll 5 is conveyed by the main roll 5 according to the rotation of the substrate feeder 3 and the substrate winder 4, and consequently the strip-shaped substrate 2 is conveyed from the substrate feeder 3 to the substrate winder 4 in a state in which the strip-shaped substrate 2 is taut overall and its surface is facing the film formation chambers 7.

The main roll chamber 6 is used to house the main roll 5 and to keep the pressure inside the chambers constant. In this embodiment, as shown in FIGS. 1 and 2, the main roll chamber 6 is a casing formed in a pentagonal shape that approximates the shape of a baseball home plate, and the main roll 5 is housed in the center portion thereof. A vacuum pump 61 is connected to the main roll chamber 6, and this vacuum pump 61 can be actuated to control the pressure inside the main roll chamber 6. In this embodiment, this pressure is set lower than that in the film formation chambers 7. Furthermore, in this embodiment, the substrate feeder 3 and the substrate winder 4 are housed in the main roll chamber 6, but the configuration may instead be such that these are provided outside the main roll chamber 6. Providing these inside the main roll chamber 6 as in this embodiment allows the strip-shaped substrate 2, as well as the strip-shaped substrate 2 after film formation (the film formation substrate), to be provided from exposure to the atmosphere.

The film formation chambers 7 are used to form a thin film on the strip-shaped substrate 2. In this embodiment, two film formation chambers 7 with the same structure are provided. These film formation chambers 7 are provided inside the main roll chamber 6, with a first film formation chamber 7a and a second film formation chamber 7b provided in that order from the upstream side. Herein, when no distinction is made between the first film formation chamber 7a and the second film formation chamber 7b, they shall simply be called the film formation chambers 7. The first film formation chamber 7a and the second film formation chamber 7b are formed by disposing partitions 62 on the outside diameter side of the main roll 5. More specifically, three substantially flat partitions 62 are provided extending toward the outer peripheral face 51 of the main roll 5 on the outside diameter side of the main roll 5, thereby forming two film formation chambers 7, which are formed by the wall surface of the main roll chamber 6, the partitions 62, and the outer peripheral face 51 of the main roll 5. Consequently, when the strip-shaped substrate 2 is conveyed along the main roll 5, the strip-shaped substrate 2 that has passed the first partition 62 is conveyed to the first film formation chamber 7a, and then the strip-shaped substrate 2 that has passed the second partition 62 is conveyed to the second film formation chamber 7b, so that thin films are successively laminated over the strip-shaped substrate 2 in the first film formation chamber 7a and the second film formation chamber 7b.

Vacuum pumps 71 are connected to these film formation chambers 7. More specifically, a vacuum pump 71a is connected to the first film formation chamber 7a, and a vacuum pump 71b is connected to the second film formation chamber 7b. These vacuum pumps 71a and 71b can be actuated to set the inside of the chambers to the specified pressure. In this embodiment, the film formation chambers 7 are reduced in pressure until a specific degree of vacuum is reached before supplying the raw material gas (thin-film material gas).

Also, these film formation chambers 7 are provided with a film formation source featuring plasma CVD as a surface treatment for the strip-shaped substrate 2. Specifically, plasma electrodes 72 for generating a plasma are provided to the film formation chambers 7, and raw material gas pipes 73 that supply raw material gas are connected. More specifically, a plasma electrode 72a (see FIG. 5) is provided to the first film formation chamber 7a, and a plasma electrode 72b (see FIG. 5) is provided to the second film formation chamber 7b. Also, raw material gas pipes 73a are connected to the first film formation chamber 7a, and raw material gas pipes 73b are connected to the second film formation chamber 7b. Consequently, a specific thin film is formed on the strip-shaped substrate 2 passing through the first film formation chamber 7a and the second film formation chamber 7b.

Specifically, high-frequency power is applied to the plasma electrodes 72 to form a plasma atmosphere within the film formation chambers 7, and when the raw material gas is supplied in this state, it is excited, and a specific thin film is formed on the strip-shaped substrate 2. In this embodiment, HMDS (hexamethyldisilazane) gas, argon gas, and hydrogen gas are supplied as the raw material gas to the first film formation chamber 7a, which forms a silicon compound film (first thin film), and HMDS and oxygen gas are supplied as the raw material gas in the second film formation chamber 7b, which forms an $SiO_2$ film (second thin film). When no distinction is to be made between the vacuum pumps 71a and 71b, the plasma electrodes 72a and 72b, and the raw material gas pipes 73a and 73b, they shall be simply called the vacuum pumps 71, the plasma electrodes 72, and the raw material gas pipes 73.

The partitions 62 are formed by flat wall pieces, and a main roll cover 8 that covers the outer peripheral face 51 of the main roll 5 is provided to the distal end portions thereof. These partitions 62 are fixed at one end to the main roll chamber 6, the other end extends toward the outer peripheral face 51 of the main roll 5, and the main roll cover 8 provided to this other end is fixed in a state of covering the main roll 5.

The main roll cover 8 is used to keep the raw material gas supplied into one film formation chamber 7 from going into the adjacent film formation chamber 7. This main roll cover 8 has film formation chamber communication components 82 that communicate with the film formation chambers 7. The pressure inside the main roll cover 8, which is formed by the outer peripheral face 51 of the main roll 5 and the main roll cover 8, is set higher than that in the film formation chambers 7, which keeps the raw material gas supplied to one film formation chamber 7 from flowing into the other film formation chamber 7.

Figure 3A:
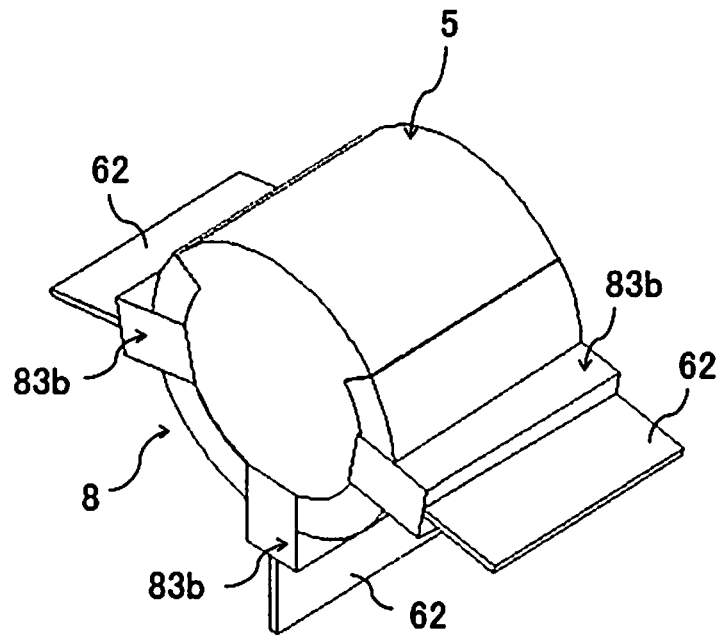
FIGS. 3A and 3B are oblique views of the main roll cover, with FIG. 3A showing the state when the main roll cover has been put on the main roll, and FIG. 3B showing the state when the main roll has been removed in FIG. 3A.
Figure 3B:
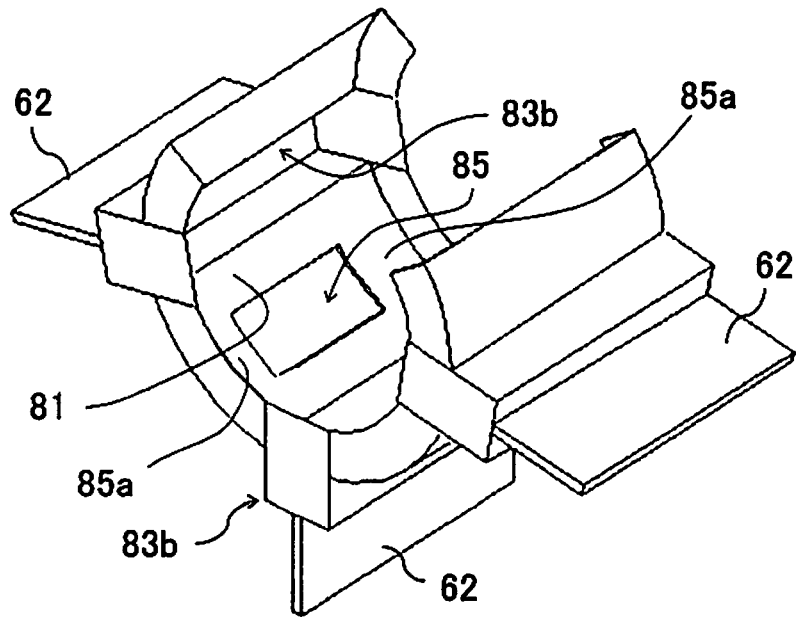
Figure 4:
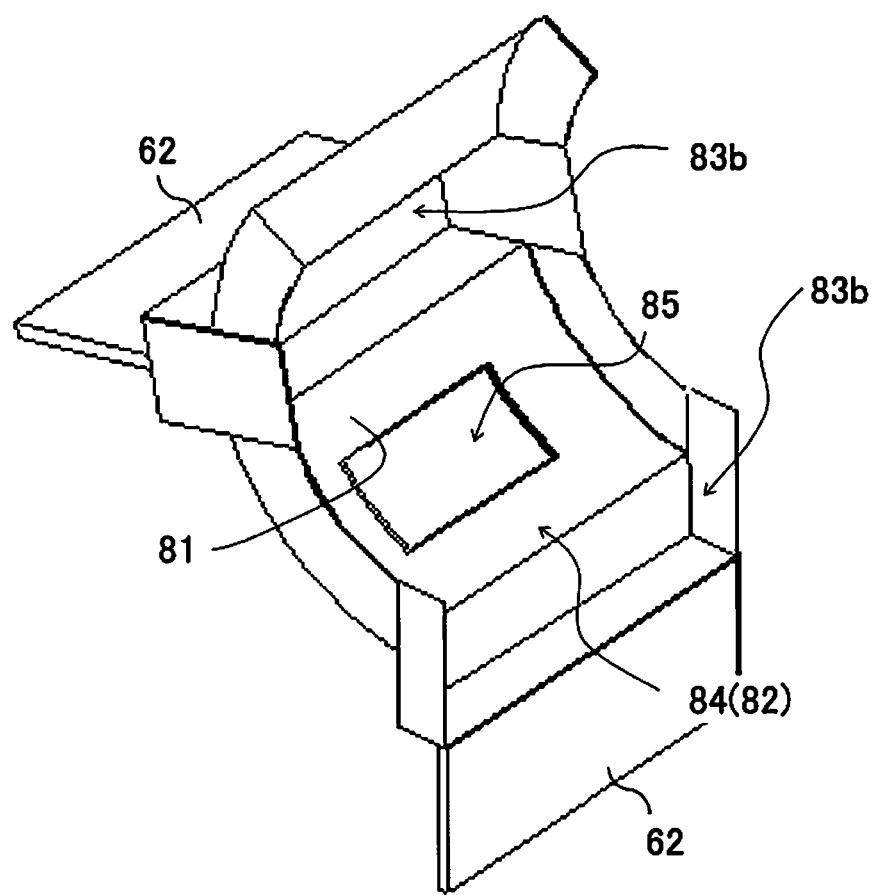
FIG. 4 shows the main roll cover divided in half.
Figure 5:
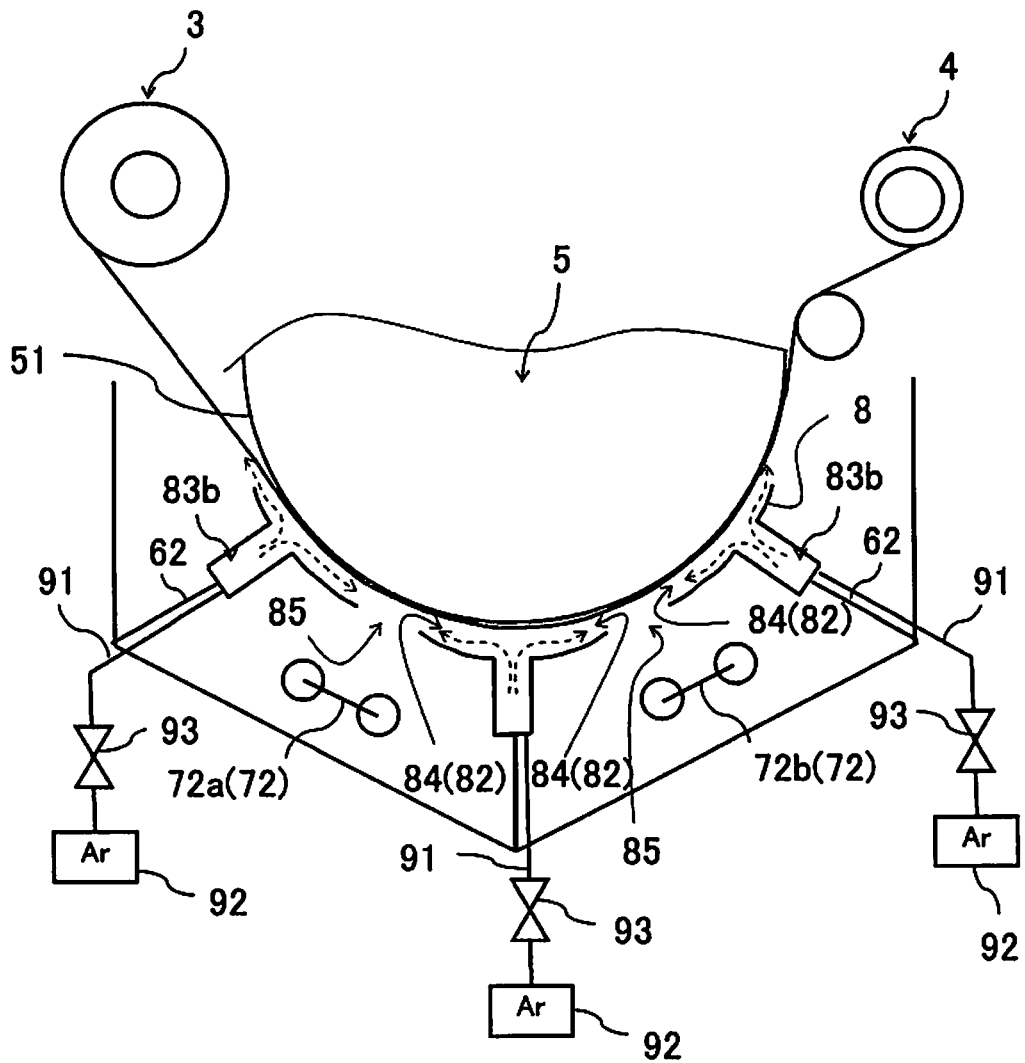
FIG. 5 is a detail view of the thin-film forming device near the main roll cover.
Figure 6:
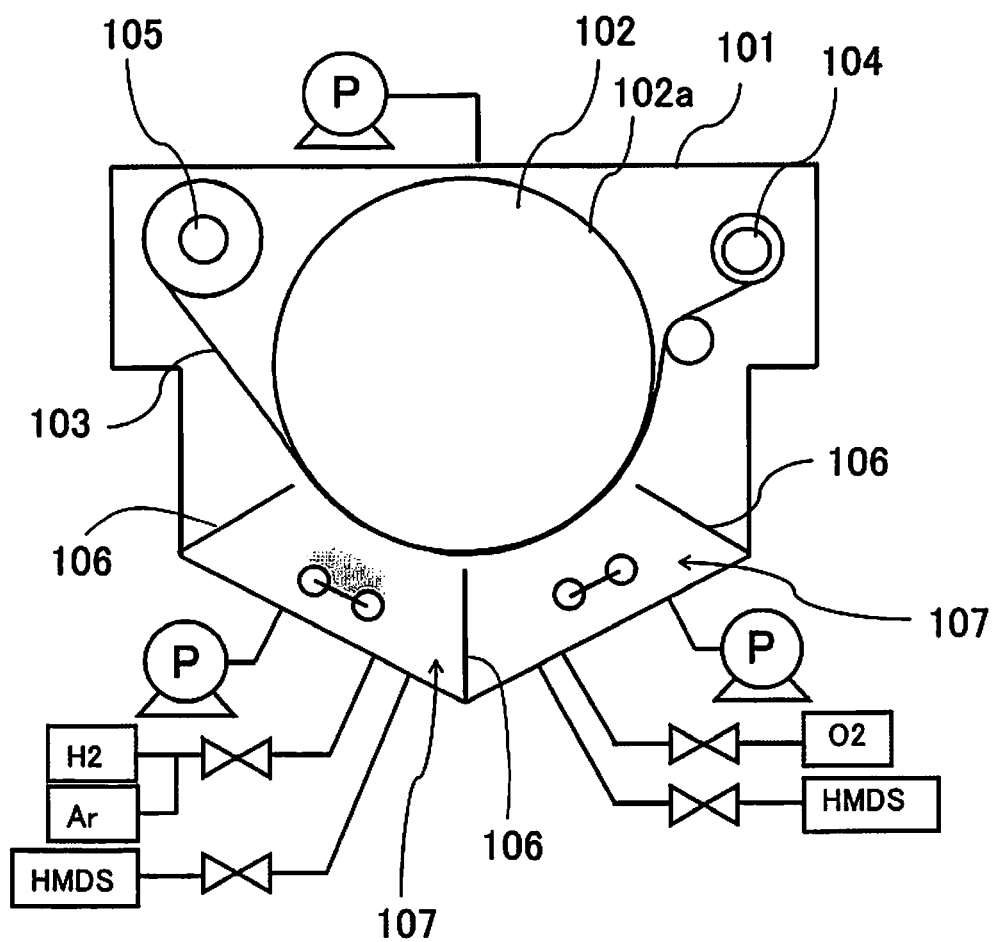
FIG. 6 shows a comparative example of the thin-film forming device.

This main roll cover 8 has a roll opposing face 81 that extends along the outer peripheral face 51 of the main roll 5. This roll opposing face 81 is used to cover the outer peripheral face 51 of the main roll 5, is opposite the outer peripheral face 51 of the main roll 5, and has a shape that conforms to the outer peripheral face 51. FIGS. 3A and 3B here are oblique views of the main roll cover 8, with FIG. 3A showing the state when the main roll cover 8 has been put on the main roll 5, and FIG. 3B showing the state when the main roll 5 has been removed in FIG. 3A. FIG. 4 shows the main roll cover 8 divided in half. FIG. 5 is a detail view of the thin-film forming device 1 near the main roll cover 8.

As shown in FIGS. 3A, 3B, 4 and 5, the main roll cover 8 is formed in a curved shape so that it is opposite the entire outer peripheral face 51 of the main roll 5. Both ends of the roll opposing face 81 are bent along the side faces of the main roll 5 so as to cover part of the side faces of the main roll 5. In a state in which the main roll cover 8 is mounted to the main roll 5, a slight gap with respect to the main roll 5 is formed between this roll opposing face 81 and the portion covering the side faces of the main roll 5. That is, since the main roll cover 8 and the main roll 5 are not in contact, the strip-shaped substrate 2 supplied along the outer peripheral face 51 of the main roll 5 does not touch the main roll cover 8, and instead travels through a cover gap 84 formed by the roll opposing face 81 and the main roll 5.

The film formation chamber communication components 82 are channels that communicate with the film formation chambers 7, and when the strip-shaped substrate 2 lying on the outer peripheral face 51 of the main roll 5 is sent through these channels, the strip-shaped substrate 2 faces into the film formation chambers 7, and a thin film is formed over the strip-shaped substrate 2.

In this embodiment, the film formation chamber communication components 82 are formed by openings 85 formed in the roll opposing face 81, and the cover gap 84 formed by the outer peripheral face 51 of the main roll 5 and the roll opposing face 81. The openings 85 allow the strip-shaped substrate 2 to face into the film formation chambers 7. In this embodiment, the openings 85 are each such that a rectangular region having a width corresponding to the film formation region of the strip-shaped substrate 2 passes through the roll opposing face 81 in the thickness direction. That is, since the strip-shaped substrate 2 has a non-film formation region in which no film formation is necessary) in the portions at both ends in the width direction, film formation needs to be suppressed in these portions. Therefore, the roll opposing face 81 has the openings 85 corresponding to the film formation region formed in the center portion in the width direction, and has mask portions 85a corresponding to the non-film formation region formed in the portions at both ends in the width direction. Specifically, the openings 85 go through the roll opposing face 81 so as to leave behind portions corresponding to the mask portions 85a. The length of the openings 85 in the travel direction of the strip-shaped substrate 2 is suitably set according to the thickness of the thin film formed on the strip-shaped substrate 2, and is related to the travel speed of the strip-shaped substrate 2. Consequently, when the strip-shaped substrate 2 conveyed along the outer peripheral face 51 of the main roll 5 passes through the openings 85 and is exposed to the film formation chambers 7, the strip-shaped substrate 2 comes into contact with the raw material gas in the film formation chambers 7 through the openings 85, allowing a thin film to be formed in the film formation region on the strip-shaped substrate 2.

Also, the cover gap 84 is formed by the outer peripheral face 51 of the main roll 5 and the roll opposing face 81 of the main roll cover 8, and the main roll cover 8 is provided so that its roll opposing face 81 will be as close as possible to the outer peripheral face 51 of the main roll 5. This cover gap 84 is formed along the outer peripheral face 51 of the main roll 5, and is formed continuously between the partitions 62. That is, the cover gap 84 is provided continuously from the openings 85 to manifolds 83b (discussed below). The size of this cover gap 84 is suitably set to allow travel along the outer peripheral face 51 of the main roll 5, without the strip-shaped substrate 2 touching the main roll cover 8, even in a state in which the strip-shaped substrate 2 on which a thin film has been formed is lying on the outer peripheral face 51 of the main roll 5. Therefore, when the strip-shaped substrate 2 is conveyed in a state of lying on the outer peripheral face 51 of the main roll 5, first the strip-shaped substrate 2 passes through the opening 85 of the first film formation chamber 7a, which results in the formation of a first thin film on the strip-shaped substrate 2. The strip-shaped substrate 2 is then conveyed in a state of lying on the outer peripheral face 51 of the main roll 5, and passes through the opening 85 of the second film formation chamber 7b, which results in the formation of a second thin film over the first thin film. In this way, the raw material gas in the film formation chambers 7 comes into contact with the strip-shaped substrate 2 through the openings 85 even in a state in which the main roll 5 is covered by the main roll cover 8, so specific thin films will be laminated on the strip-shaped substrate 2 by passing through the first film formation chamber 7a and the second film formation chamber 7b.

The manifolds 83b here are portions connected to the adjacent film formation chamber communication components 82, and are formed so as to have a larger space than the cover gap 84 of the film formation chamber communication components 82. Inert gas supply pipes 91 that supply inert gas are connected to these manifolds 83b. These inert gas supply pipes 91 are connected to inert gas tanks 92, and the amount of inert gas supplied to the manifolds 83b can be adjusted by adjusting valves 93 provided along the pipe path. In this embodiment, the amount of inert gas supplied is adjusted so that the pressure inside the manifolds 83b will be higher than the pressure in the film formation chambers 7. That is, at the least, the pressure is set to be higher than the pressure in the two adjacent film formation chambers 7 that communicate through the film formation chamber communication components 82, as seen from the manifolds 83b. In this embodiment, argon gas is supplied as the inert gas, but some other inert gas besides argon gas may be used as long it is a gas that does not affect film formation.

This makes it less likely that the raw material gas supplied to one film formation chamber 7 will find its way into the adjacent film formation chamber 7. That is, if an inert gas is supplied from the inert gas supply pipes 91, the inert gas will fill the manifolds 83b and the pressure inside the main roll cover 8 will be higher than the pressure in the film formation chambers 7. The inert gas in the manifolds 83b will then go through the film formation chamber communication components 82 and into the adjacent film formation chamber 7 (broken lines in FIG. 5). Therefore, even if the raw material gas supplied to a film formation chamber 7 tries to get into the film formation chamber communication component 82, since the pressure inside the main roll cover 8 is set higher, the gas will be pushed back into the original film formation chamber 7 by the inert gas in the film formation chamber communication component 82, and will be less likely to find its way into the other film formation chamber 7. Furthermore, because the gas supplied to the manifolds 83b is an inert gas, it will not affect film formation whatsoever, even if it gets into the film formation chambers 7.

Next, the method for forming a thin film on the strip-shaped substrate 2 with the above-mentioned thin-film forming device 1 will be described.

First, the strip-shaped substrate 2 that is wound around the feed roll 31 of the substrate feeder 3 is put in place, and the strip-shaped substrate 2 is laid over the outer peripheral face 51 of the main roll 5, after which it is pulled over to the winding roll 41 of the substrate winder 4. The vacuum pumps 61 and 71 of the main roll chamber 6 and the film formation chamber 7 are then actuated to bring the interiors of the chambers up to the specified degree of vacuum.

Once the chambers have reached the specified degree of vacuum, high-frequency power is applied to the plasma electrodes 72, and raw material gas is supplied from the raw material gas pipes 73 of the film formation chamber 7. At this point the degree of vacuum in the film formation chamber 7 is worse than before the raw material gas was supplied. Here, let us assume that the pressure P1 in the first film formation chamber 7*a* is greater than the pressure P2 in the second film formation chamber 7*b*. However, since the pressure P0 in the main roll chamber 6 is kept at a degree of vacuum, there is almost no change. Therefore, the relation between the pressures is effectively that of P1>P2≧P0.

Next, the substrate feeder 3 and the substrate winder 4 are driven to convey the strip-shaped substrate 2 at a specific speed. In the first film formation chamber 7*a*, the raw material gas that has been activated by exposure to a plasma atmosphere goes through the opening 85 in the main roll cover 8 and touches the strip-shaped substrate 2, and a first thin film is formed on the surface of the strip-shaped substrate 2. Specifically, the strip-shaped substrate 2 is conveyed along the outer peripheral face 51 of the main roll 5 through the inside of the cover gap 84, while coming into contact with the raw material gas coming in through the opening 85, and this forms the first thin film in the lengthwise direction on the surface of the strip-shaped substrate 2.

Here, because the opening surface area (cross sectional area) of the cover gap 84 is formed small, and because there is some distance to the manifolds 83*b*, pressure loss increases, and the raw material gas coming in through the opening 85 is actively prevented from flowing out of the first film formation chamber 7*a*.

Also, at the manifolds 83*b*, since the inert gas is supplied to set the pressure inside the main roll cover 8 higher than in the film formation chamber 7, any raw material gas that should happen to get in through the opening 85 will be pushed back into the film formation chamber 7 by the inert gas, which avoids incursion into the manifolds 83*b*. Specifically, the raw material gas in the first film formation chamber 7*a* is less likely to go through the film formation chamber communication component 82 and into the second film formation chamber 7*b*.

Next, the strip-shaped substrate 2 that has passed through the first film formation chamber 7*a* and a manifold 83*b* goes through the communication component of the second film formation chamber 7*b* and into the second film formation chamber 7*b*, and is exposed to the raw material gas in the second film formation chamber 7*b* through the opening 85, which forms a second thin film over the first thin film. After the first and second thin films have been laminated on the strip-shaped substrate 2, the strip-shaped substrate 2 (finished substrate) is wound onto the substrate winder 4.

As to the outflow of raw material gas from the second film formation chamber 7*b*, since the pressure inside the main roll cover 8 is set higher than that in the film formation chambers 7 just as with the raw material gas in the first film formation chamber 7*a*, any raw material gas that should come in through the opening 85 will be pushed back into the second film formation chamber 7*b* by the inert gas, and will be unlikely to go into the manifold 83*b*.

Thus providing the main roll cover 8 to the main roll 5 and setting the pressure inside the main roll cover 8 higher than the pressure in the film formation chambers 7 makes it less likely that the raw material used in one film formation chamber 7 will find its way into the adjacent film formation chamber 7. Therefore, it will be less likely that the film quality will be decreased by an admixing of the raw material gases in different film formation chambers 7, the purity of the raw material gas used in each film formation chamber 7 can be maintained, and the quality of the films that are formed can be more consistent.

In the above embodiment, an example was described in which the manifolds 83*b* were provided and inert gas was supplied to these manifolds 83*b*, but the manifolds 83*b* need not be provided, and the inert gas may be supplied directly into the main roll cover 8. More specifically, the configuration may be such that the roll opposing face 81 is formed continuously, including the portion where the main roll cover 8 is connected to the partitions 62, and the inert gas supply pipes 91 are connected to the roll opposing face 81 located between the openings 85 in the film formation chambers 7. Again with this configuration, as long as the inert gas supplied from the inert gas supply pipes 91 is adjusted so that the pressure inside the main roll cover 8 formed by the outer peripheral face 51 of the main roll 5 and the main roll cover 8 is higher than the pressure in the film formation chambers 7, then the raw material gas used in one film formation chamber 7 will be less likely to find its way into the adjacent film formation chamber 7.

Also, in the above embodiment a case was described in which there were two film formation chambers 7, but three or more film formation chambers 7 may be provided by increasing the number of partitions 62.

The invention claimed is:

1. A thin-film forming device for forming a thin film on a strip-shaped substrate by subjecting the strip-shaped substrate to a surface treatment while conveying the strip-shaped substrate in a state of being laid along an outer peripheral face of a main roll, the thin-film forming device comprising:
   a main roll chamber accommodating the main roll;
   a plurality of film formation chambers arranged in a peripheral direction of the main roll, the film formation chambers each accommodating a film formation source for the surface treatment;
   a plurality of partitions disposed radially outward of the main roll, the partitions forming the film formation chambers therebetween, one of the partitions being disposed between an adjacent pair of the film formation chambers in the peripheral direction of the main roll to separate the adjacent pair of the film formation chambers with respect to each other;
   a main roll cover attached to the partitions and provided continuously between adjacent partitions, the main roll cover including
      a plurality of manifolds configured to receive an inert gas,
      a roll opposing face radially located closer to the outer peripheral face of the main roll than the film formation source and radially facing the outer peripheral face of the main roll over which the strip-shaped substrate travels, the roll opposing face having openings that pass therethrough corresponding to film formation regions and a mask portion that is formed corresponding to a non-film formation region, and
      a pair of side opposing faces extending radially and inwardly from side edges of the roll opposing face and axially facing peripheral portions of axial end faces of the main roll, the main roll cover having a film formation chamber communication component that is defined by a cover gap between the roll opposing face and the outer peripheral face of the main roll and communicates with the adjacent pair of the film formation chambers through the openings of the roll opposing face;
   inert gas suppliers connected to the manifolds of the main roll cover to supply the inert gas at locations corresponding to the partitions to an interior of the main roll cover defined between the main roll cover and the outer peripheral face of the main roll during forming the thin film on the strip-shaped substrate such that a pressure in the interior of the main roll cover at the locations corresponding to the partitions is higher than a pressure in the adjacent pair of the film formation chambers; and a vacuum pump connected to the main roll chamber at a location opposite the film formation chambers with respect to the main roll such that a pressure inside the main roll chamber is lower than the pressure in the adjacent pair of the film formation chambers.

2. The thin-film forming device according to claim 1, wherein
the inert gas suppliers each include an inert gas supply pipe configured to supply the inert gas to the interior of the main roll cover.

3. The thin-film forming device according to claim 1, wherein
the inert gas suppliers include a plurality of inert gas supply pipes configured to supply the inert gas to the interior of the main roll cover.

4. The thin-film forming device according to claim 3, wherein
the manifolds are spaced apart from each other in the peripheral direction of the main roll.

5. The thin-film forming device according to claim 1, wherein
the openings are spaced apart from each other in the peripheral direction of the main roll.

6. The thin-film forming device according to claim 1, wherein
the mask portion is disposed between the openings and a side edge of the roll opposing face in a direction parallel to an axial direction of the main roll.

* * * * *